(12) United States Patent
Chuang et al.

(10) Patent No.: US 9,257,381 B2
(45) Date of Patent: Feb. 9, 2016

(54) SEMICONDUCTOR PACKAGE, AND INTERPOSER STRUCTURE OF THE SEMICONDUCTOR PACKAGE

(71) Applicant: Siliconware Precision Industries Co., Ltd., Taichung (TW)

(72) Inventors: Kuan-Wei Chuang, Taichung Hsien (TW); Chun-Tang Lin, Taichung Hsien (TW); Yi-Chian Liao, Taichung Hsien (TW); Yi-Che Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 314 days.

(21) Appl. No.: 13/722,017

(22) Filed: Dec. 20, 2012

(65) Prior Publication Data

US 2014/0070424 A1   Mar. 13, 2014

(30) Foreign Application Priority Data

Sep. 10, 2012  (TW) .............................. 101132953 A (51) Int. Cl.
| | |
|---|---|
| *H01L 23/14* | (2006.01) |
| *H01L 23/498* | (2006.01) |
| *H01L 21/78* | (2006.01) |
| *H01L 23/00* | (2006.01) |
| *H01L 21/48* | (2006.01) |

(52) U.S. Cl.
CPC ........ *H01L 23/49827* (2013.01); *H01L 21/486* (2013.01); *H01L 21/78* (2013.01); *H01L 23/147* (2013.01); *H01L 24/97* (2013.01); *H01L 23/49816* (2013.01); *H01L 2224/16* (2013.01); *H01L 2924/351* (2013.01)

(58) Field of Classification Search
CPC ....... H01L 23/498; H01L 21/78; H01L 24/97; H01L 23/147
USPC .......................... 257/774, 778, 777; 438/113
See application file for complete search history.

(56) References Cited

U.S. PATENT DOCUMENTS

| | | | | |
|---|---|---|---|---|
| 8,008,121 | B2* | 8/2011 | Choi et al. ..................... | 438/107 |
| 8,067,308 | B2* | 11/2011 | Suthiwongsunthorn et al. ............................. | 438/618 |
| 8,138,014 | B2* | 3/2012 | Chi et al. ....................... | 438/106 |
| 8,143,097 | B2* | 3/2012 | Chi et al. ....................... | 438/107 |
| 8,338,945 | B2* | 12/2012 | Yu et al. ......................... | 257/737 |
| 2012/0056329 | A1* | 3/2012 | Pagaila et al. .................. | 257/774 |
| 2013/0161836 | A1* | 6/2013 | Yeom et al. .................... | 257/778 |
| 2014/0145300 | A1* | 5/2014 | Bhagavat .......... H01L 29/66181 257/532 |  |
| 2014/0159233 | A1* | 6/2014 | Lin ........................ H01L 25/105 257/737 |  |
| 2014/0175633 | A1* | 6/2014 | Lin .......................... H01L 23/36 257/712 |  |

* cited by examiner

*Primary Examiner* — Evan Pert
(74) *Attorney, Agent, or Firm* — Mintz Levin Cohn Ferris Glovsky and Popeo, P.C.; Peter F. Corless; Steven M. Jensen (57) ABSTRACT

A method of fabricating a semiconductor package is provided, including: cutting a substrate into a plurality of interposers; disposing the interposers in a plurality of openings of a carrier, wherein the openings are spaced from one another by a distance; forming a first encapsulant to encapsulate the interposers; removing the carrier; and disposing at least a semiconductor element on each of the interposers. By cutting the substrate first, good interposers can be selected and rearranged such that finished packages can be prevented from being wasted due to inferior interposers.

9 Claims, 7 Drawing Sheets

SEMICONDUCTOR PACKAGE, AND INTERPOSER STRUCTURE OF THE SEMICONDUCTOR PACKAGE

CROSS-REFERENCE TO RELATED APPLICATIONS

This application claims the benefit of Taiwanese Application 101132953 filed on Sep. 10, 2012, the entire contents of which is incorporated herein by reference.

BACKGROUND OF THE INVENTION

1. Field of the Invention

The present invention relates to semiconductor packages, and, more particularly, to a semiconductor package having through silicon vias (TSV), a method of fabricating the semiconductor package, and an interposer structure of the semiconductor package.

2. Description of Related Art

Flip-chip technologies facilitate to reduce chip packaging sizes and shorten signal transmission paths and therefore have been widely used for chip packaging. Various types of packages, such as chip scale packages (CSP), direct chip attached (DCA) packages and multi-chip module (MCM) packages, can be achieved through flip-chip technologies.

In a flip-chip packaging process, a great coefficient of thermal expansion (CTE) mismatch between a chip and a packaging substrate adversely affects the formation of joints between conductive bumps of the chip and contacts of the packaging substrate, thus likely resulting in delamination of the conductive bumps from the packaging substrate. On the other hand, along with increased integration of integrated circuits, a CTE mismatch between a chip and a packaging substrate induces more thermal stresses and leads to more serious warpage, thereby reducing the product reliability and resulting in failure of a reliability test.

To overcome the above-described drawbacks, a silicon interposer is disposed between a semiconductor chip and a packaging substrate. Since the silicon interposer and the semiconductor chip are made of similar materials, the above-described drawbacks caused by a CTE mismatch can be effectively prevented.

Figure 1A:
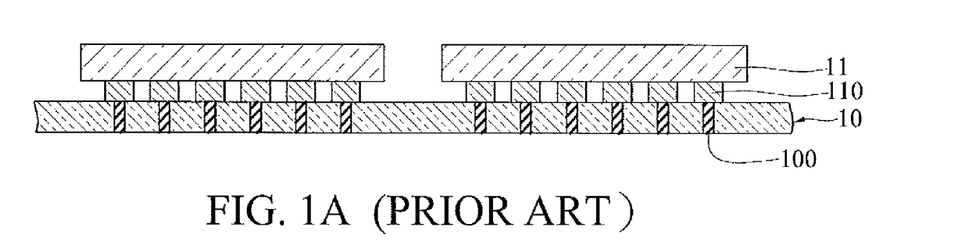
FIGS. 1A to 1C are cross-sectional views showing a method of fabricating a conventional semiconductor package.
Figure 1B:
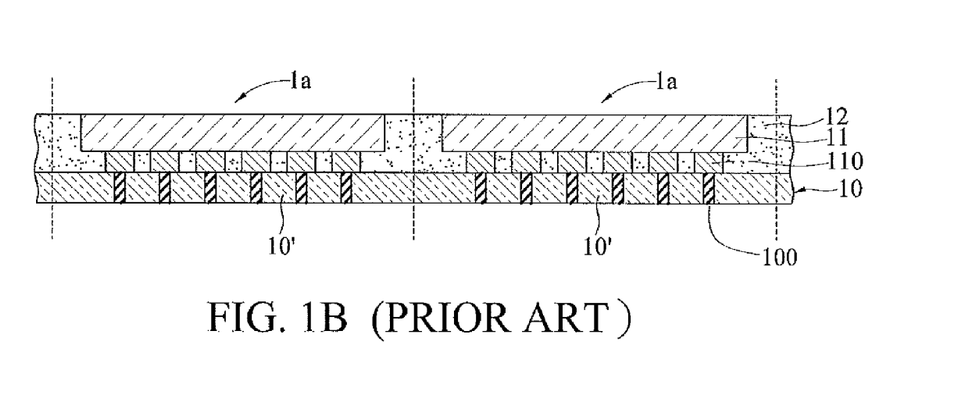
Figure 1C:
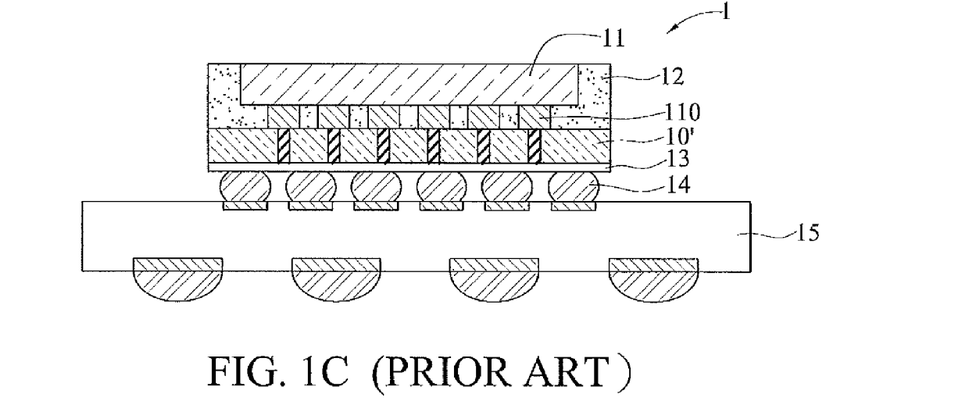

FIGS. 1A to 1C show a method of fabricating a conventional semiconductor package 1.

Referring to FIG. 1A, a plurality of TSVs 100 are formed in a silicon interposer 10, and a redistribution layer (RDL) structure (not shown) is formed on an upper side of the silicon interposer 10. A plurality of semiconductor chips 11 are disposed on the upper side of the silicon interposer 10 and electrically connected to the TSVs 100 through a plurality of conductive bumps 110.

Referring to FIG. 1B, an encapsulant 12 is formed on the silicon interposer 10 to encapsulate the semiconductor chips 11, thereby forming a plurality of packages 1a.

Referring to FIG. 1C, an RDL structure 13 is formed on a lower side of the silicon interposer 10 according to the practical need, and then a singulation process is performed to obtain a plurality of singulated packages 1a. Each of the packages 1a is disposed on and electrically connected to a packaging substrate 15 through a plurality of conductive bumps 14.

However, forming the through silicon vias 100 in the silicon interposer 10 results in a high fabrication cost. Further, according to the process yield, some units 10' of the silicon interposer 10 may be inferior. Although a good semiconductor chip 11 can be selected by performing an electrical performance test after a singulation process, the good semiconductor chip 11 may be disposed on an inferior unit 10'. As such, the finished package 1a cannot pass a reliability test, and consequently the good semiconductor chip 11 must be wasted along with the inferior unit 10', thereby increasing the fabrication cost.

On the other hand, if inferior units 10' are detected before forming the encapsulant 12 so as to avoid disposing of good semiconductor chips 11 on the inferior units 10', it will become difficult to control the amount and flow path of the encapsulant 12. Consequently, the semiconductor chips 11 cannot be evenly covered by the encapsulant 12.

In addition, since the silicon interposer 10 is not singulated before disposing the semiconductor chips 11 on the silicon interposer 10, the semiconductor chips 11 are required to be less in size than the corresponding units 10', such that the number of the electrodes of the semiconductor chips 11 is limited. Consequently, the module function and efficiency of the units 10' are limited.

Therefore, how to overcome the above-described drawbacks has become urgent.

SUMMARY OF THE INVENTION

In view of the above-described drawbacks, the present invention provides a semiconductor package, which comprises: a first encapsulant; an interposer embedded in the first encapsulant, wherein the interposer has opposite first and second surfaces, side surfaces connected to the opposite first and second surfaces, and a plurality of conductive through holes penetrating the first and second surfaces, each of the conductive through holes having a first end at the first surface and a second end opposite to the first end, and the side surfaces of the interposer being covered by the first encapsulant; and at least a semiconductor element disposed on and electrically connected to the first surface of the interposer.

The present invention further provides a method of fabricating a semiconductor package, which comprises: providing a substrate having opposite first and second surfaces and a plurality of conductive through holes penetrating the first surface, wherein each of the conductive through holes has a first end at the first surface and a second end opposite to the first end; cutting the substrate into a plurality of interposers, wherein each of the interposers has side surfaces connecting the first and second surfaces thereof; disposing the interposers on a carrier through the first surfaces thereof, wherein the carrier has a plurality of openings so as for the interposers to be disposed therein and the openings are spaced from one another by a distance; forming a first encapsulant on the carrier so as to cover the side surfaces of the interposers and encapsulate the interposers; removing the carrier; and disposing and electrically connecting at least a semiconductor element to the first surface of each of the interposers.

In an embodiment, the first surface of each of the interposers further has a plurality of conductive elements electrically connected to the first ends of the conductive through holes, and the conductive elements are disposed in a corresponding one of the openings of the carrier. After the carrier is removed, the semiconductor element is bonded and electrically connected to the conductive elements.

In an embodiment, the method further comprises forming an adhesive in the openings of the carrier so as to bond the interposers to the carrier.

In an embodiment, the method, after disposing the semiconductor element on the interposer, further comprises performing a singulation process so as to form a plurality of semiconductor packages.

In an embodiment, the first surface of the interposer further has a redistribution layer (RDL) structure so as for the semiconductor element to be disposed thereon and electrically connected to the first ends of the conductive through holes through the RDL structure.

In an embodiment, an RDL structure are formed on the second surface of the interposer and electrically connected to the second ends of the conductive through holes.

In an embodiment, the semiconductor element and the first ends of the conductive through holes of the interposer are electrically connected through a plurality of conductive elements.

In an embodiment, the conductive elements protrude above the first encapsulant.

In an embodiment, a second encapsulant is further formed on the first encapsulant for encapsulating the semiconductor element.

In an embodiment, one side of the semiconductor element opposite to the interposer is exposed from the second encapsulant.

In an embodiment, the method further comprises removing a portion of the interposer so as to expose the second ends of the conductive through holes of the interposer.

The present invention further provides an interposer structure, which comprises: an encapsulant; and an interposer embedded in the encapsulant, wherein the interposer has opposite first and second surfaces, side surfaces connected to the opposite first and second surfaces, and a plurality of conductive through holes penetrating the first and second surfaces, each of the conductive through holes having a first end at the first surface and a second end opposite to the first end, and the side surfaces of the interposer being covered by the encapsulant.

In an embodiment, the first surface of the interposer is flush with a surface of the encapsulant.

In an embodiment, the second surface of the interposer and the second ends of the conductive through holes are covered by the encapsulant.

In an embodiment, the second surface of the interposer and the second ends of the conductive through holes are exposed from the encapsulant.

In an embodiment, the second surface of the interposer and the second ends of the conductive through holes are flush with a surface of the encapsulant.

In an embodiment, the interposer structure further comprises an RDL structure formed on the first surface of the interposer and electrically connected to the first ends of the conductive through holes. In an embodiment, a plurality of conductive elements are formed on the RDL structure and protrude above the encapsulant. In an embodiment, the RDL structure is flush with a surface of the encapsulant.

In an embodiment, the interposer structure further comprises a plurality of conductive elements formed on the first surface of the interposer and protruding above the encapsulant.

In an embodiment, the interposer structure further comprises an RDL structure formed on the second surface of the interposer and electrically connected to the second ends of the conductive through holes.

Therefore, by cutting the substrate first, good interposers can be selected and rearranged in the openings of the carrier so as for good semiconductor elements to be disposed thereon. As such, finished packages can be prevented from being wasted due to inferior interposers, thereby reducing the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "first", "second", "upper", "lower", "a" etc., are merely for illustrative purpose and should not be construed to limit the scope of the present invention.

FIGS. 2A to 2H are cross-sectional views showing a method of fabricating a semiconductor package 2 according to a first embodiment of the present invention.

Figure 2A:
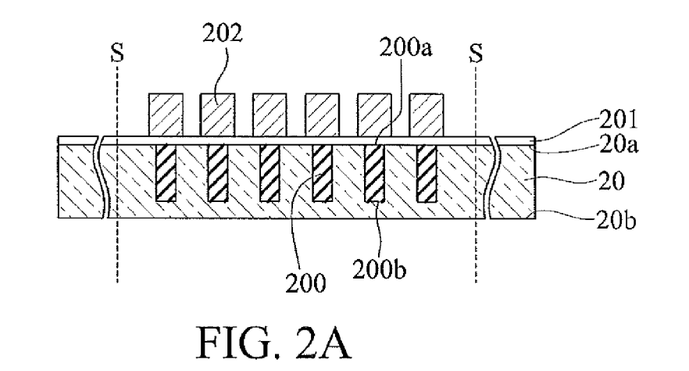
FIGS. 2A to 2H are cross-sectional views showing a method of fabricating a semiconductor package according to a first embodiment of the present invention, wherein FIG. 2A' is an upper view of FIG. 2A.

Referring to FIGS. 2A and 2A', a substrate 20 having a first surface 20a and a second surface 20b opposite to the first surface 20a is provided. A plurality of conductive through holes 200 are formed in the substrate 20 and penetrating the first surface 20a. Each of the conductive through holes 200 has a first end 200a exposed from the first surface 20a of the substrate 20 and a second end 200b opposite to the first end 200a.

In an embodiment, the substrate 20 is a wafer or other silicon-containing material. If needed, a redistribution layer (RDL) structure 201 can be formed on the first surface 20a of the substrate 20 and electrically connected to the first ends 200a of the conductive through holes 200.

In an embodiment, a plurality of conductive elements 202 are further formed on the RDL structure 201 and electrically connected to the first ends 200a of the conductive through holes 200 directly or through the RDL structure 201.

The conductive elements 202 are metal bumps such as copper bumps with a solder material formed thereon.

Figure 2B:
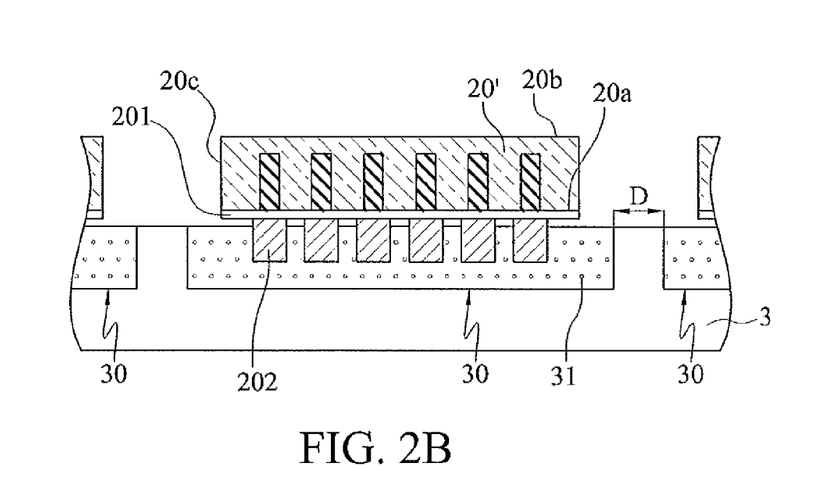

Referring to FIG. 2B, the substrate 20 is cut along a cutting path S (as shown in FIGS. 2A and 2A') so as to form a plurality of interposers 20'. Each of the interposers 20' has side surfaces 20c connecting the first and second surfaces 20a, 20b.

A carrier 3 having a plurality of openings 30 is provided, and the interposers 20' are disposed in the openings 20 of the carrier 3 through the first surfaces 20a thereof. The openings 30 are spaced from one another by a distance D.

In an embodiment, the distance D is greater than the width t of the cutting path S.

The conductive elements 202 of each of the interposers 20' are disposed in the corresponding opening 30 of the carrier 3, and an adhesive 31 is formed in the opening 30 to bond with the interposer 20' and encapsulate the conductive elements 202, thereby fixing the interposer 20' to the carrier 3.

The conductive elements 202 can be, but not limited to, bumps or posts.

Figure 2C:
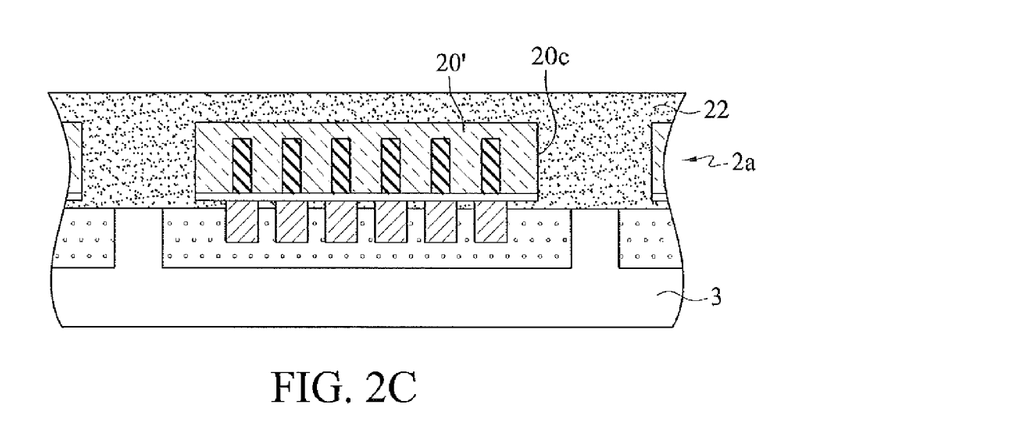

Referring to FIG. 2C, a first encapsulant 22 is formed on the carrier 3 to cover the side surfaces 20c of the interposers 20' and encapsulate the interposers 20', thereby forming a package 2a.

Figure 2D:
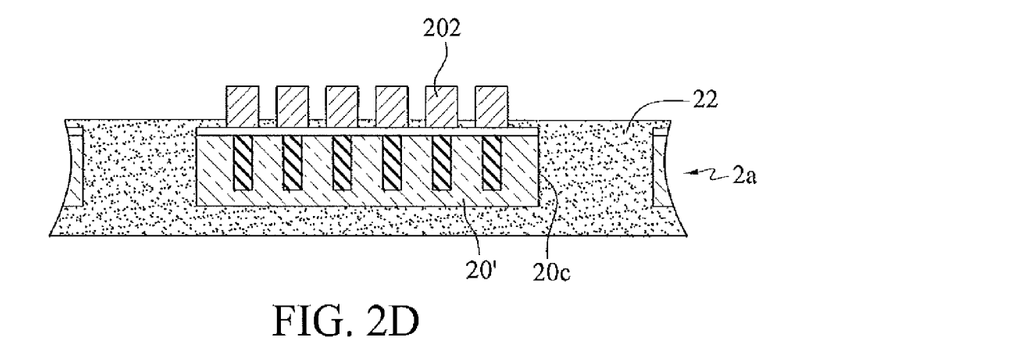

Referring to FIG. 2D, the carrier 3 is removed so as for the conductive elements 202 to protrude above the surface of the first encapsulant 22.

Figure 2E:
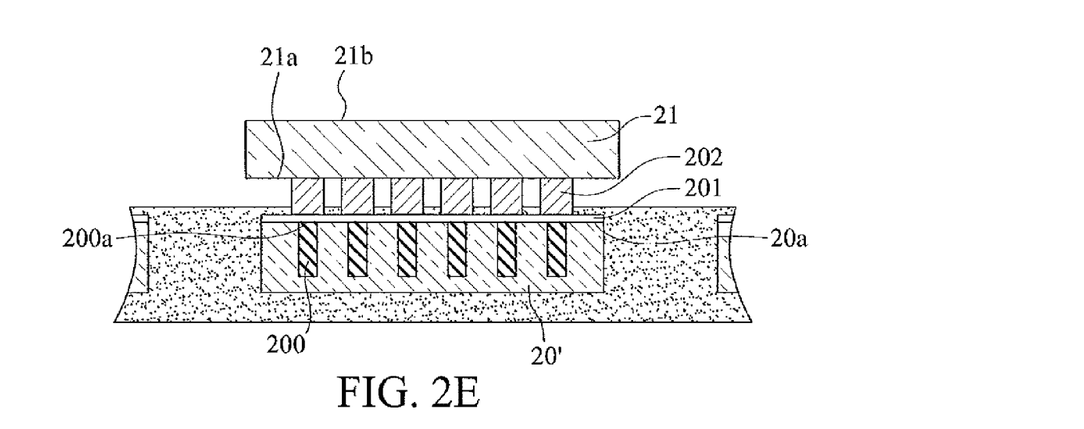

Referring to FIG. 2E, one or more semiconductor elements 21 are disposed on the first surface 20a of each of the interposers 20'.

In an embodiment, the semiconductor element 21 is a chip and has an active surface 21a and a non-active surface 21b opposite to the active surface 21a. The semiconductor element 21 is disposed on the conductive elements 202 through the active surface 21a thereof and electrically connected to the RDL structure 201 of the interposer 20' or the first ends 200a of the conductive through holes 200 through the conductive elements 202.

In another embodiment, the conductive elements 202 are disposed on the semiconductor element 21 instead of the RDL structure 201. After the carrier 3 is removed, the semiconductor element 21 is disposed on the first surface 20a of the interposer 20' through the conductive elements 202.

Further, the active surface 21a of the semiconductor element 21 can be directly bonded to the first surface 20a of the interposer 20' or the RDL structure 201 instead of through the conductive elements 202.

Figure 2F:
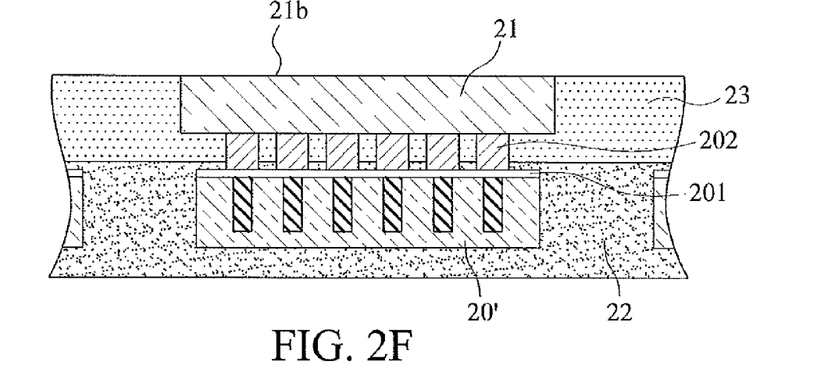

Referring to FIG. 2F, a second encapsulant 23 is formed on the first encapsulant 22 to encapsulate the semiconductor elements 21 and the conductive elements 202.

In an embodiment, an upper portion of the second encapsulant 23 is removed by grinding such that the non-active surface 21b of the semiconductor element 21 is flush with an upper surface of the second encapsulant 23. As such, the non-active surface 21b of the semiconductor element 21 is exposed from the second encapsulant 23.

The non-active surface 21b of the semiconductor element 21 is exposed from the second encapsulant 23 for heat dissipation.

Figure 2G:
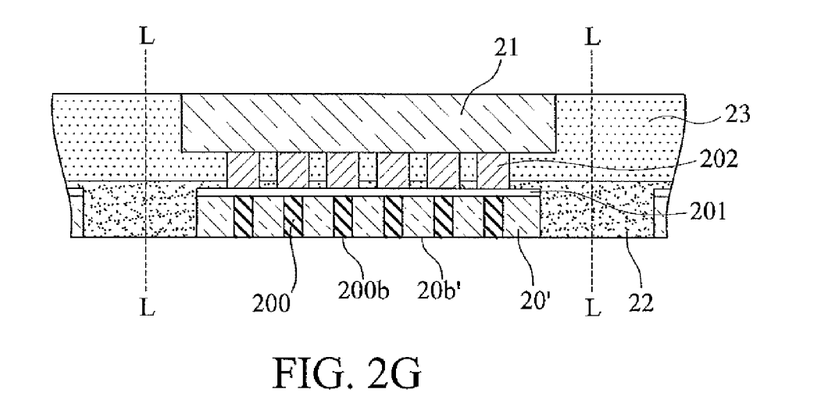

Referring to FIG. 2G a lower portion of the first encapsulant 22 and a lower portion of the interposer 20' are removed so as for the lower surface of the first encapsulant 22 and the second surface 20b' of the interposer 20' to be flush with the second ends 200b of the conductive through holes 200, thereby exposing the second ends 200b of the conductive through holes 200.

Figure 2H:
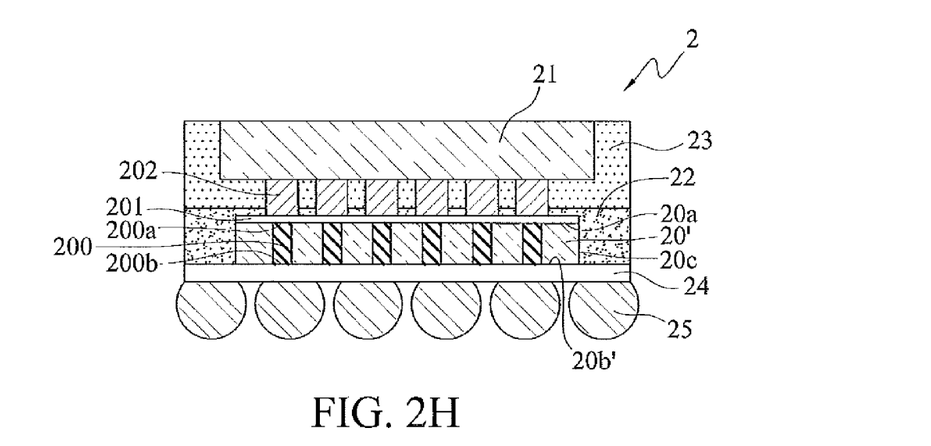

Referring to FIG. 2H, an RDL structure 24 is formed on the lower surface of the first encapsulant 22 and the second surface 20b' of the interposer 20' and electrically connected to the second ends 200b of the conductive through holes 200.

Then, a plurality of conductive elements 25 such as solder balls are formed on the RDL structure 24, which allows an electronic device (not shown) such as a packaging substrate or a circuit board to be disposed thereon after a singulation process.

Subsequently, a singulation process is performed along a cutting path L (as shown in FIG. 2H) so as to obtain a plurality of semiconductor packages 2.

Figure 3A:
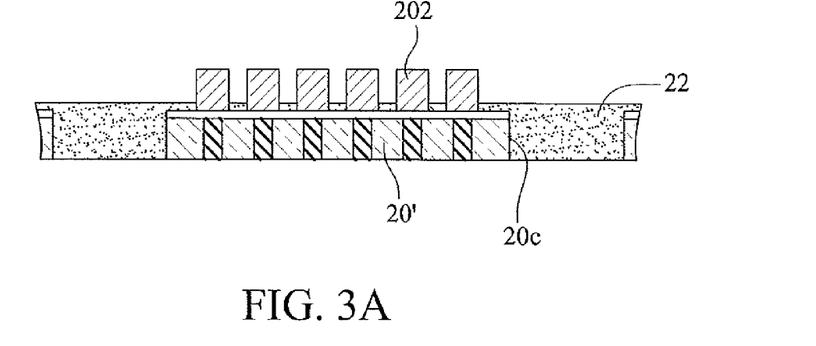
FIGS. 3A to 3C are cross-sectional views showing a method of fabricating a semiconductor package according to a second embodiment of the present invention, wherein FIGS. 3A' and 3B' shows another embodiment of FIGS. 3A and 3B.
Figure 3B:
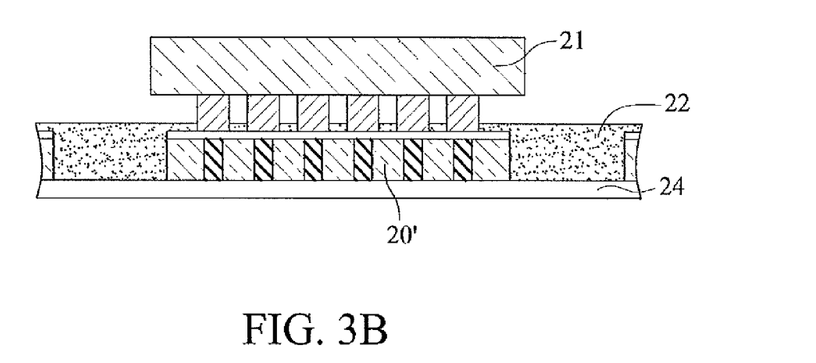
Figure 3C:
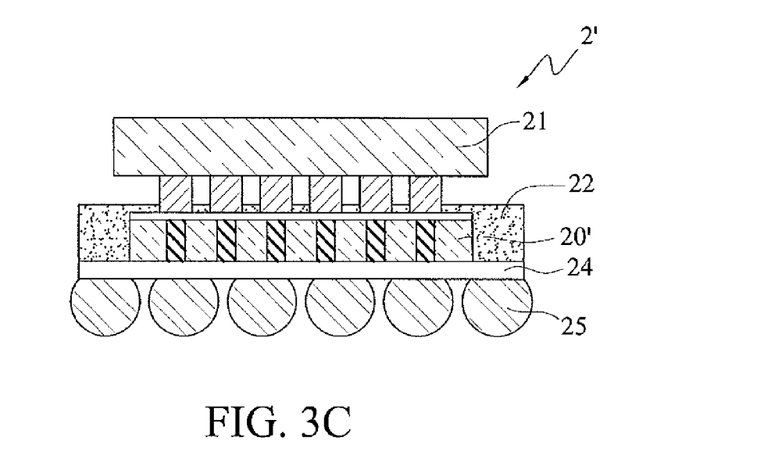

FIGS. 3A to 3C are cross-sectional views showing a method of fabricating a semiconductor package 2' according to a second embodiment of the present invention. The second embodiment differs from the first embodiment in that in the second embodiment the second encapsulant 23 is not formed.

Referring to FIG. 3A, continued from FIG. 2D, a protection film (not shown) is formed to cover the conductive elements 202, and a lower portion of the interposer 20' and a lower portion of the first encapsulant 22 are removed by grinding such that the second surface 20b' of the interposer 20' and the lower surface of the first encapsulant 22 are flush with the second ends 200b of the conductive through holes 200, thereby exposing the second ends 200b of the conductive through holes 200.

Referring to FIG. 3B, an RDL structure 24 is formed on the second surface 20b' of the interposer 20' and the lower surface of the first encapsulant 22. Then, the protection film is removed and a semiconductor element 21 is disposed on the conductive elements 202.

Referring to FIG. 3C, a plurality of conductive elements 25 are formed on the RDL structure 24 and then a singulation process is performed.

In another embodiment, referring to FIG. 3A', continued from FIG. 2C, the interposer 20' and the first encapsulant 22 are partially removed, and an RDL structure 24 and a plurality of conductive elements 25 are formed on the interposer 20' and the first encapsulant 22. Then, referring to FIG. 3B', the carrier 3 is removed and a semiconductor element 21 is disposed on the interposer 20'. Subsequently, a singulation process is performed to form the structure of FIG. 3C.

By cutting the substrate 20 first, good interposers 20' can be selected and rearranged so as for good semiconductor elements 21 to be disposed thereon. Therefore, the present invention overcomes the conventional drawbacks and reduces the fabrication cost.

Further, by rearranging the interposers 20' in the openings 30 of the carrier 3, the present invention facilitates alignment of the interposers and the carrier. Furthermore, since the distance D between the interposers 20' rearranged on the carrier is greater than the original distance between the interposers 20' on the substrate 20, i.e., the width t of the cutting path S, the semiconductor elements 21 can be greater in size than the interposers 20'. Therefore, the number of the electrodes of the semiconductor elements 21 can be increased according to the practical need so as to improve the module function and efficiency of the interposers 20'.

The present invention further provides a semiconductor package 2, 2', which has: a first encapsulant 22, an interposer 20' embedded in the first encapsulant 22 and a semiconductor element 21 disposed on the first encapsulant 22.

The interposer 20' has opposite first and second surfaces 20a, 20b' and side surfaces 20c connecting the opposite first and second surfaces 20a, 20b'. The interposer 20' further has a plurality of conductive through holes 200 penetrating the first and second surfaces 20a, 20b'. Each of the conductive through holes 200 has a first end 200a exposed from the first surface 20a and a second end 200b opposite to the first end 200a. The side surfaces 20c of the interposer 20' are covered by the first encapsulant 22.

The semiconductor element 21 has an active surface 21a and a non-active surface 21b opposite to the active surface 21a. The semiconductor element 21 is disposed on and electrically connected to first surface 20a of the interposer 20' through the active surface 21a thereof.

The semiconductor package 2 further has a second encapsulant 23 formed on the first encapsulant 22 for encapsulating the semiconductor element 21. The non-active surface 21b of the semiconductor element 21 is exposed from the second encapsulant 23.

The semiconductor package 2, 2' further has an RDL structure 24 formed on the first encapsulant 22 and the second surface 20b' of the interposer 20' and electrically connected to the second ends 200b of the conductive through holes 200.

The semiconductor package 2, 2' further has an RDL structure 201 formed between the semiconductor element 21 and the first surface 20a of the interposer 20' and electrically connected to the first ends 200a of the conductive through holes 200.

In an embodiment, the active surface 21a of the semiconductor element 21 and the first ends 200a of the conductive through holes 200 are electrically connected through a plurality of conductive elements 202. The conductive elements 202 protrude above the first encapsulant 22.

In an embodiment, the second surface 20b' of the interposer 20' and the second ends 200b of the conductive through holes 200 are exposed from the first encapsulant 22.

Figure 4A:
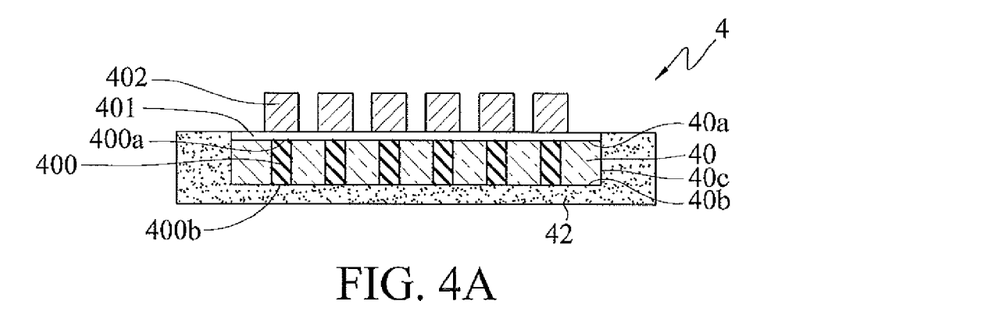
FIGS. 4A to 4C are cross-sectional views showing an interposer structure according to different embodiments of the present invention.
Figure 4B:
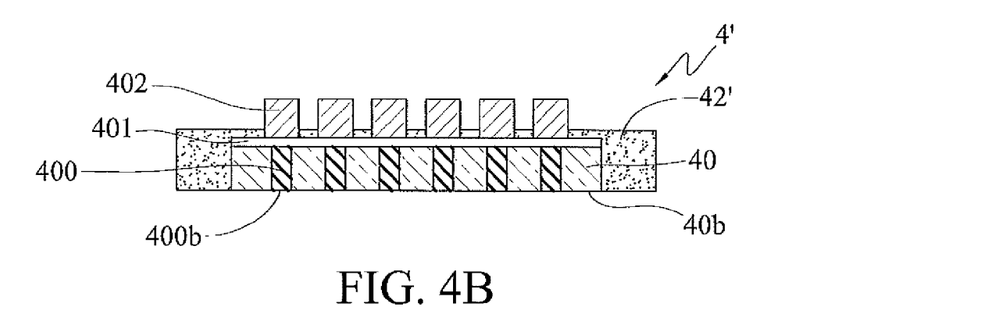
Figure 4C:
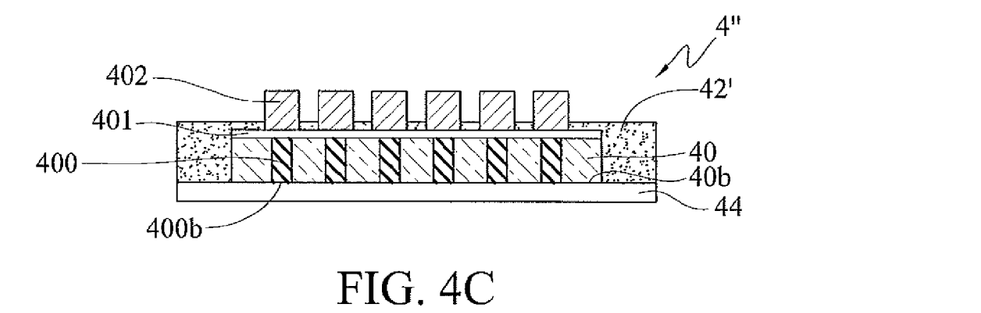

FIGS. 4A to 4C show an interposer structure 4, 4', 4" according to different embodiments of the present invention. The interposer structure 4, 4', 4" has an encapsulant 42, 42' and an interposer 40 embedded in the encapsulant 42, 42'.

The interposer 40 has opposite first and second surfaces 40a, 40b and side surfaces 40c connecting the first and second surfaces 40a, 40b. The interposer 40 further has a plurality of conductive through holes 400 penetrating the first and second surfaces 40a, 40b. Each of the conductive through holes 400 has a first end 400a exposed from the first surface 40a and a second end 400b opposite to the first end 400a.

The side surfaces 40c of the interposer 40 are covered by the encapsulant 42, 42'.

The interposer structure 4, 4', 4" further has an RDL structure 401 formed on the first surface 40a of the interposer 40 and electrically connected to the first ends 400a of the conductive through holes 400.

The interposer structure 4, 4', 4" further has a plurality of conductive elements 402 formed on the first surface 40a of the interposer 40 and protruding above the encapsulant 42, 42'. In an embodiment, the conductive elements 402 are formed on the RDL structure 401.

In an embodiment, the RDL structure 401 is flush with the encapsulant 42, as shown in FIG. 4A. In another embodiment, if no RDL structure 401 is disposed on the first surface 40a of the interposer 40, the first surface 40a of the interposer 40 is flush with the encapsulant 42. Referring to FIGS. 4B and 4C, the RDL structure 401 (or the first surface 40a of the interposer 40 and the first ends 400a of the conductive through holes 400) can be covered by the encapsulant 42'.

In an embodiment, referring to FIG. 4A, the second surface 40b of the interposer 40 and the second ends 400b of the conductive through holes 400 are covered by the encapsulant 42.

In an embodiment, referring to FIG. 4B, the second surface 40b of the interposer 40 and the second ends 400b of the conductive through holes 400 are exposed from the encapsulant 42'. For example, the second surface 40b of the interposer 40 and the second ends 400b of the conductive through holes 400 are flush with the lower surface of the encapsulant 42'. Referring to FIG. 4C, the interposer structure 4" further has another RDL structure 44 formed on the second surface 40b of the interposer 40 and the encapsulant 42' and electrically connected to the second ends 400b of the conductive through holes 400.

Therefore, by cutting the substrate first, good interposers can be selected and rearranged in the openings of the carrier so as for good semiconductor elements to be disposed thereon. As such, finished packages can be prevented from being wasted due to inferior interposers, thereby reducing the fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a first encapsulant;
   an interposer embedded in the first encapsulant, wherein the interposer has opposite first and second surfaces, side surfaces connected to the opposite first and second surfaces, and a plurality of conductive through holes penetrating the first and second surfaces, each of the conductive through holes having a first end at the first surface and a second end opposite to the first end, the second surface of the interposer arranged to dispose a packaging substrate thereon, and the side surfaces of the interposer being covered by the first encapsulant;
   at least a semiconductor element disposed on and electrically connected to the first surface of the interposer; and
   a second encapsulant formed on the first encapsulant to encapsulate the semiconductor element.

2. The semiconductor package of claim 1, further comprising a plurality of conductive elements formed between the semiconductor element and the first surface of the interposer for electrically connecting the semiconductor element to the first surface of the interposer.

3. The semiconductor package of claim 2, wherein the conductive elements protrude above the first encapsulant.

4. The semiconductor package of claim 1, wherein one side of the semiconductor element opposite to the interposer is exposed from the second encapsulant.

5. The semiconductor package of claim 1, wherein the second surface of the interposer and the second ends of the conductive through holes are exposed from the first encapsulant.

6. The semiconductor package of claim 1, further comprising a redistribution layer (RDL) structure formed on the second surface of the interposer and electrically connected to the second ends of the conductive through holes.

7. The semiconductor package of claim 1, wherein the second surface of the interposer and the second ends of the conductive through holes are exposed from the first encapsulant.

8. The semiconductor package of claim 1, further comprising an RDL structure formed on the second surface of the interposer and electrically connected to the second ends of the conductive through holes.

9. The semiconductor package of claim 1, further comprising an RDL structure formed between the semiconductor element and the first surface of the interposer for electrically connecting the semiconductor element and the first ends of the conductive through holes.

* * * * *